(12) United States Patent
Rorro et al.

(10) Patent No.: US 12,159,260 B2
(45) Date of Patent: Dec. 3, 2024

(54) COORDINATION PLATFORM FOR WAREHOUSE OPERATIONS

(71) Applicant: Target Brands, Inc., Minneapolis, MN (US)

(72) Inventors: Michael Rorro, Minneapolis, MN (US); Alexander J. Meyer, Minneapolis, MN (US); Chuong Bui, Minneapolis, MN (US)

(73) Assignee: Target Brands, Inc., Minneapolis, MN (US)

( * ) Notice: Subject to any disclaimer, the term of this patent is extended or adjusted under 35 U.S.C. 154(b) by 121 days.

(21) Appl. No.: 17/122,699

(22) Filed: Dec. 15, 2020

(65) Prior Publication Data

US 2022/0188767 A1 Jun. 16, 2022

(51) Int. Cl.
*G06Q 10/0875* (2023.01)
*G06F 30/20* (2020.01)
*G06Q 10/0631* (2023.01)

(52) U.S. Cl.
CPC ......... *G06Q 10/0875* (2013.01); *G06F 30/20* (2020.01); *G06Q 10/063118* (2013.01)

(58) Field of Classification Search
CPC ............. G06Q 10/063; G06Q 10/0631; G06Q 10/06311; G06Q 10/063112;
(Continued)

(56) References Cited

U.S. PATENT DOCUMENTS 10,643,157 B2   5/2020   De et al.
10,699,223 B1 *  6/2020   Shah ................. G06Q 10/06311

(Continued)

FOREIGN PATENT DOCUMENTS

JP    2008009818 A  *  1/2008  ............ G06F 19/00
WO   2014008307        1/2014
(Continued)

OTHER PUBLICATIONS

"A Simulation-Based Optimization Method for Warehouse Worker Assignment", by Odkhishig Ganbold, Kaustav Kundu, Haobin Lin and Wei Zhang. Department of Industrial Systems Engineering and Management, Faculty of Engineering, National University of Singapore. Dec. 4, 2020. (Year: 2020).*

(Continued)

*Primary Examiner* — Pan G Choy
(74) *Attorney, Agent, or Firm* — Barnes & Thornburg LLP (57) ABSTRACT

A warehouse coordination system receives warehouse data that represents a current warehouse state, and performance data that represents historical performance of warehouse workers. The warehouse coordination system generates and stores enhanced warehouse data, and provides the data for a plan creation user interface for a warehouse process. The warehouse coordination system receives, through the plan creation user interface, user input that indicates workers to be applied to tasks to be performed over a shift for the warehouse process, and a simulation command to perform a simulation of the tasks. In response to receiving the simulation command, the warehouse coordination system performs a simulation of tasks according to the user inputs, and stores a simulated warehouse process plan that specifies the tasks. The warehouse coordination system receives real-time data that indicates tasks being performed over the shift, and provides the data for a performance monitoring interface for the warehouse process.

8 Claims, 6 Drawing Sheets

(58) Field of Classification Search
CPC ... G06Q 10/063114; G06Q 10/063116; G06Q 10/063118; G06Q 10/0875; G06F 30/20
See application file for complete search history.

(56) References Cited

U.S. PATENT DOCUMENTS

| | | | |
|---|---|---|---|
| 2002/0174038 A1* | 11/2002 | Chien | G06Q 10/087 |
| | | | 705/28 |
| 2003/0171962 A1 | 9/2003 | Hirth et al. | |
| 2004/0267591 A1 | 12/2004 | Hedlund et al. | |
| 2007/0162435 A1* | 7/2007 | Hadari | G06Q 10/087 |
| 2009/0006164 A1 | 1/2009 | Kaiser et al. | |
| 2014/0279660 A1 | 9/2014 | Santavicca et al. | |
| 2018/0068255 A1* | 3/2018 | Hance | G06Q 10/087 |
| 2018/0107961 A1 | 4/2018 | Kiuchi et al. | |
| 2018/0158548 A1* | 6/2018 | Taheri | G06Q 10/1093 |
| 2018/0293527 A1* | 10/2018 | Amirjalayer | G06Q 10/087 |
| 2019/0102228 A1* | 4/2019 | Fuller | G06F 16/904 |
| 2019/0347606 A1* | 11/2019 | Malecha | G06Q 30/0223 |
| 2020/0118062 A1* | 4/2020 | Greenwell | G06Q 10/1091 |
| 2020/0317449 A1* | 10/2020 | Baijens | G06Q 10/08 |
| 2021/0073703 A1* | 3/2021 | Lioznova | G06Q 50/2057 |

FOREIGN PATENT DOCUMENTS

| | | | | |
|---|---|---|---|---|
| WO | WO-2014008307 A2 * | 1/2014 | | G06Q 10/04 |
| WO | WO-2018187689 A1 * | 10/2018 | | G06Q 10/063 |

OTHER PUBLICATIONS

"Warehouse Management System (WMS)" by SAP ERP]6.0 EHP7SP17, SAP Help Portal, Jun. 4, 2020. (Year: 2020).*
anylogic.com [online], "Modeling Approaches," Mar. 30, 2018, retrieved from https://help.anylogic.com/index.jsp, 16 pages.
anylogic.com [online], "Simulation Software for Every Business Challenge," Mar. 30, 2018, retrieved from https://www.anylogic.com/features/, 7 pages.
anylogic.com [online], "Supply Chain GIS (Agent-based)," Mar. 30, 2018, retrieved from https://help.anylogic.com/index.jsp, 33 pages.
help.sap.com [online], "Warehouse Management System (WMS)," Jun. 4, 2020, retrieved from http://help.sap.com/viewer/34fc810a607e4ae5a287b6e233b8566f/6.17.17/en-US, 109 pages.
ims360.com [online], "irms 360 Cloud Warehouse Management System," Jun. 4, 2020, retrieved from https://www.ims360.com/products/ims-cloud-wms, 3 pages.
Omnna Inventory Management [online], "Overall Inventory Management", 8 pages.
oracle.com [online], "Task Management," 2020, //docs.oracle.com/en/, 36 pages.
oracle.com [online], "Wave Planning," 2020, //docs.oracle.com/en/, 31 pages.
skulocity.com [online], "Production Planning," 2016, retrieved on Jun. 3, 2020, retrieved from www.skulocity.com/production-planning/, 6 pages.

* cited by examiner

COORDINATION PLATFORM FOR WAREHOUSE OPERATIONS

TECHNICAL FIELD

This specification generally relates to a platform that includes integrated planning, simulation, and reporting tools, for coordinating warehouse operations, such as processes for distributing physical items from a warehouse to a store.

BACKGROUND

Warehouse management systems (WMS) can perform a variety of operations to manage the physical distribution of goods in and out of warehouses. For example, a WMS can receive orders to be distributed from a warehouse and can translate those orders into specific warehouse operations, such as selecting particular pallets from locations in the warehouse and loading them onto trucks for distribution. WMS systems have traditionally been designed to focus on processing orders within the warehouse. For example, a WMS may simply identify operations that are needed to fulfill an order and send those out to be performed by the next available resource within the warehouse (e.g., send out instructions to forklift operator).

Simulation modeling platforms have been used to facilitate simulation modeling for various business and industrial processes. Within the simulation platforms, users may develop custom models for discrete elements (e.g., processes and agents), and may define interactions between the elements. By performing simulations, for example, experiments may be conducted to determine how randomness and parameter changes affect model behavior. Simulation results may be analyzed and changes may be made based on the analysis to improve the business and industrial processes.

SUMMARY

This document generally describes computer systems, processes, program products, and devices for providing a platform that includes integrated planning, simulation, and reporting tools, for coordinating warehouse operations among multiple different groups/teams within a warehouse. For example, a warehouse may include multiple different teams who are assigned a specific set of tasks, such as a team receiving inbound shipments (e.g., unloading pallets from trucks arriving at warehouse), another team handling storage and retrieval operations (e.g., moving pallets in and around the warehouse), another team handling sortation operations (e.g., breaking apart goods on pallets and packing pallets using goods from different pallets), and another team performing shipping operations (e.g., assembling and loading outbound pallets onto trucks for distribution to retail stores). For efficiency, workers in a warehouse can be assigned to different teams to distribute the labor and operations that are performed. However, unharmonious workflow between the different teams in the warehouse can create inefficiencies because the operations that are performed among teams within a warehouse are linked to each other. For example, a receiving team working too quickly to unload inbound trucks to a warehouse can create a backlog of pallets in the dock area of the warehouse, which then makes the operations performed by a storage and retrieval team and/or a shipping team less efficient. Similarly, under-utilized labor on the receiving team can degrade the productivity of the storage and retrieval team and/or the sortation team even though those teams may have the capacity to work at a faster pace.

The disclosed technology provides solutions to these problems by generating plans that provide for harmonious coordination among teams within a warehouse that take into account relationships among teams to provide for improved efficiency for the warehouse and its teams as a whole, instead of simply for each team individually. For example, the disclosed technology provides a warehouse operation coordination platform that includes labor and production planning tools for generating and simulating detailed work plans at the team level (e.g., receiving, storage and retrieval, sortation, and shipping), and performance monitoring tools for monitoring various performance metrics (e.g., productivity, throughput, safety, etc.), across multiple teams to provide for a more efficient overall operation with coordination among the multiple teams. For instance, the disclosed technology can generate plans for each team, including the allocation of workers among the teams, that are easy to follow and that provide for synchronization among the multiple teams so that one team is not working too far ahead of or behind of other teams and thus injecting inefficiencies into the system. The end result is a plan that, when followed by each team, provides an efficient and balanced outcome for the warehouse as a whole (e.g., maximize throughput of pallets through warehouse) even though it may require one or more team to work at a pace that is below their maximum output.

The disclosed technology can also provide for a platform that includes reporting tools for providing work progress information with respect to the generated plans, which can be used by the teams to dynamically adjust approaches to obtaining a predicted outcome specified by the plans, while conducting warehouse operations. For example, a team may be working ahead of schedule, which may prompt an adjustment (e.g., a resource adjustment, a staffing adjustment, etc.) for that team and/or other teams, to provide an improved outcome. Through use of the platform by operations managers of the various teams according to a specified schedule, work processes can be better coordinated among the teams, including through the use of dynamic adjustments while the plan is being performed, for example, and overall efficiency and throughput can be increased in a warehouse environment.

In some implementations, a method performed by data processing apparatuses includes receiving, by a warehouse coordination system and from one or more warehouse management systems, warehouse data that represents a current state of a warehouse; receiving, by the warehouse coordination system and from one or more performance tracking systems, performance data that represents historical performance of workers in the warehouse; generating, by the warehouse coordination system, enhanced warehouse data based on the warehouse data and the performance data, and storing the enhanced warehouse data; providing, by the warehouse coordination system, data for a plan creation user interface for a warehouse process, wherein the plan creation user interface presents at least a portion of the enhanced warehouse data; receiving, by the warehouse coordination system and through the plan creation user interface, (i) user input that indicates workers to be applied to tasks to be performed over a shift for the warehouse process, and (ii) a simulation command to perform a simulation of the tasks to be performed over the shift for the warehouse process; in response to receiving the user input and the simulation command, (i) performing, by the warehouse coordination system, the simulation of the tasks to be performed over the shift for the warehouse process, according to the user inputs, (ii) determining, by the warehouse coordination system, an output of the simulation of the tasks to be performed over the shift, and (ii) storing, by the warehouse coordination system, a simulated warehouse process plan that specifies the tasks to be performed over the shift; receiving, by the warehouse coordination system, real-time warehouse data that indicates tasks being performed over the shift for the warehouse process; and providing, by the warehouse coordination system, data for a performance monitoring interface for the warehouse process, wherein the performance monitoring interface presents a comparison between the real-time warehouse data and the simulated warehouse process plan.

Other implementations of this aspect include corresponding computer systems, and include corresponding apparatus and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

These and other implementations can include any, all, or none of the following features. The warehouse data can include data that indicates locations and contents of containers of goods in the warehouse, and a backlog of tasks to be performed in the warehouse. The performance data can include data that indicates productivity rates of workers as defined by a number of tasks previously performed by the workers over a defined time range. The real-time warehouse data can include one or more identifiers for a task that has been performed, and a timestamp that indicates a time at which the task has been performed. Generating enhanced warehouse data can include mapping performance capabilities of workers in the warehouse as indicated by the performance data, to a backlog of tasks to be performed in the warehouse as indicated by the warehouse data. Generating enhanced warehouse data can include generating configuration data that indicates how the warehouse is operationally and physically configured, such that a data linkage is maintained between the tasks to be performed over the shift and the workers to be applied to the tasks. Performing the simulation of the tasks to be performed over the shift for the warehouse process can include applying productivity rates of the workers to be applied to the tasks to predict how many of the tasks are expected to be accomplished during the shift. Performing the simulation of the tasks to be performed over the shift for the warehouse process can include modeling the tasks to be performed according to an assigned sequence of tasks over time, using a collection of state variables that represent workers and containers in the warehouse. Performing the simulation of the tasks can include performing, for each of multiple different warehouse teams, a respective simulation of tasks to be performed over the shift by the warehouse team, wherein an output of the simulation of the tasks to be performed over the shift by a first warehouse team is used as an input for creating a warehouse process plan including tasks to be performed over the shift by a second warehouse team. The user input and the simulation command can be received through the plan creation user interface that includes interface controls for selecting and sequencing the tasks to be performed over the shift, indicating the workers to be applied to the tasks, and providing the simulation command to perform the simulation of the tasks. The performance monitoring interface can include a graphical indication of the real-time warehouse data over time relative to the simulated warehouse process plan over time.

The systems, devices, program products, and processes described throughout this document can, in some instances, provide one or more of the following advantages. Data from warehouse management systems (WMS) and performance tracking systems can be ingested, enhanced, and stored, such that processes for generating work plans can execute without burdening the WMS and performance tracking systems, conserving system resources. A workflow can be provided that deepens understanding of both operations and planning processes, providing transparency to plan details while automating manual data sourcing and input. Feasible and integrated work plans can be efficiently generated. Planning simulation tools can be used to test process improvement and/or physical layout changes in a warehouse before the changes are implemented, facilitating process and layout improvements. Work plans can be based on a low level of available detail to produce a high level of output precision. Work plans for multiple different teams can be coordinated with a shared set of priorities among the teams, increasing production efficiencies throughout a warehouse. Planning processes can be standardized across warehouses that have similar operational structures. A consistent user experience can be delivered through a standardized set of tools, increasing collaboration between teams during a common planning process, and improving in-depth understanding of holistic operations by managers and higher-level leadership.

Other features, aspects and potential advantages will be apparent from the accompanying description and figures.

DESCRIPTION OF DRAWINGS

Like reference symbols in the various drawings indicate like elements

DETAILED DESCRIPTION

This document describes technology that can coordinate warehouse operations through the use of integrated planning, simulation, and reporting tools. In general, warehouse operations managers (e.g., leaders of various warehouse teams, such as receiving, storage and retrieval, sortation, and shipping teams) may lack specific tools for creating detailed production plans and for monitoring holistic warehouse performance. For example, using manual techniques and/or ad hoc tools, a warehouse operations manager may spend several hours over the course of a shift collecting and organizing data from multiple different sources to create a production plan for their team and track team performance according to the plan. Further, a production plan created for a team through manual data aggregation and production planning techniques may be difficult to coordinate with production plans created for other teams. For example, a receiving team may be responsible for receiving goods delivered to a warehouse (e.g., unloading cartons from a truck), and a storage and retrieval team may be responsible for storing those goods in the warehouse (e.g., delivering cartons to specific warehouse locations). If production plans for the receiving team and the storage and retrieval team are independently created, for example, a production plan for the receiving team may specify that the team is to receive more goods than the storage and retrieval team is capable of storing, resulting in production inefficiencies throughout the warehouse.

The warehouse operation coordination platform described in this document includes labor and production planning tools for generating detailed work plans for warehouses at the team level (e.g., receiving, storage and retrieval, sortation, and shipping), across multiple teams. The platform also includes reporting tools for providing real-time information about work progress with respect to the generated plans, such that work across the various teams can be better coordinated, and production staffing needs can be shifted when appropriate. At a high level, the platform has three main components: a data ingestion component that receives relevant data from warehouse management systems (WMS) and performance tracking systems used to generate the work plans, a plan creation tool through which operation managers can generate and simulate plans for their portion of the warehouse, and a performance monitoring tool that provides work progress information to each of the operation managers to promote collaboration between the teams.

Figure 1A:
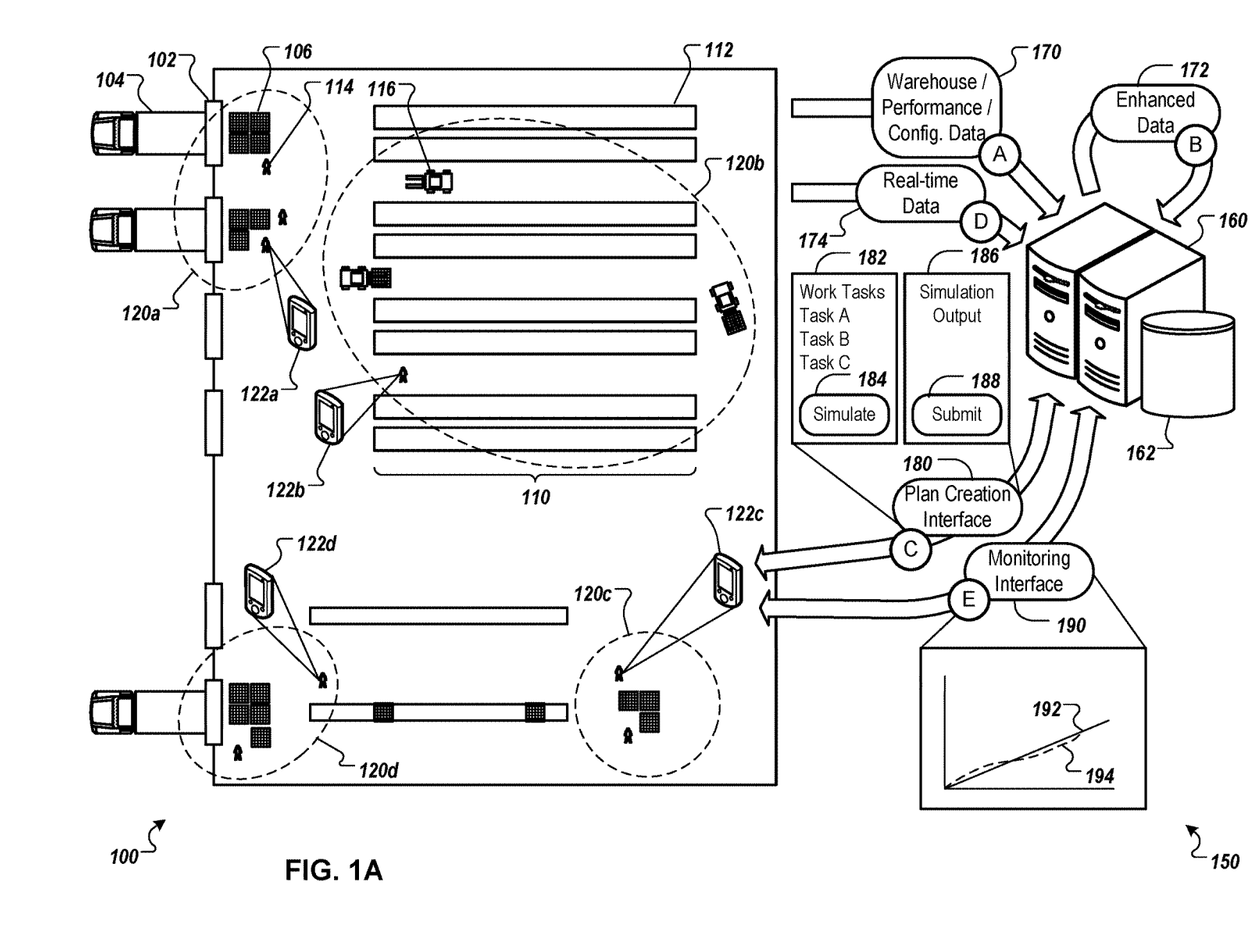
FIG. 1A is a conceptual drawing of an example warehouse environment, and an example system for generating warehouse process plans and coordinating warehouse operations.

FIG. 1A is a conceptual diagram of an example warehouse environment 100, and an example system 150 for generating warehouse process plans and coordinating warehouse operations, as represented in example stages (A) to (E). Stages (A) to (E) may occur in the illustrated sequence, or they may occur in a sequence that is different than in the illustrated sequence, and/or two or more stages (A) to (E) may be concurrent. In some examples, one or more stages (A) to (E) may be repeated multiple times during a warehouse shift.

The warehouse environment 100 can be a storage warehouse, a packing warehouse, a retail warehouse, a distribution center, or another sort of warehouse or facility, for example. In the present example, the warehouse environment 100 includes multiple docks 102 at which vehicles 104 (e.g., trucks) can be loaded and/or unloaded with various containers 106 (e.g., pallets, boxes, etc., containing various goods). The warehouse environment 100 in the present example also includes a storage area 110, which can include various storage racks 112 which can be arranged in rows and/or columns and configured to store the containers 106 in different levels. For example, elevators and/or rack conveyor belts may be used to elevate the containers 106 to different levels and move them to and from desired locations in the storage racks 112. Various workers 114 and equipment 116 (e.g., forklifts, pallet jacks, automated guided vehicles (AGVs), etc.) can be employed in the warehouse environment 100, for example, to perform various warehouse tasks.

In general, workers and equipment may be organized into different teams, each team performing a different sort of task in the warehouse environment. For example, a receiving team 120a can include workers 114 and/or equipment 116 for performing various receiving tasks, such as unloading containers 106 from vehicles 104. A storage and retrieval team 120b, for example, can include workers 114 and/or equipment 116 for performing various storage and/or retrieval tasks, such as moving the containers 106 throughout the warehouse environment 100, placing the containers 106 in the storage racks 112, and removing the containers 106 from the storage racks 112. A sortation team 120c, for example, can include workers 114 and/or equipment 116 for performing various sortation tasks, such as breaking apart containers 106 of goods and/or repackaging goods into different containers 106. A shipping team 120d, for example, can include workers 114 and/or equipment 116 for performing various shipping tasks, such as loading containers 106 into outbound vehicles 104 for transportation to other locations (e.g., warehouses, distribution centers, stores, customer locations, etc.).

In general, each team may include and/or be directed by one or more operations managers that use computer applications running on computing devices to create work plans for their team (e.g., a work plan that specifies work to be performed by the team during a shift), and to monitor the progress of the team according to the work plan (e.g., over the course of the shift). For example, an operations manager of the receiving team 120a can use computing device 122a, an operations manager of the storage and retrieval team 120b can use computing device 122b, an operations manager of the sortation team 120c can use computing device 122c, and an operations manager of the shipping team 120d can use computing device 122d. Each of the computing devices 122a-d, for example, can be various forms of stationary or mobile processing devices including, but not limited to a desktop computer, a laptop computer, a tablet computer, a personal digital assistant (PDA), a smartphone, or other processing devices.

Figure 1B:
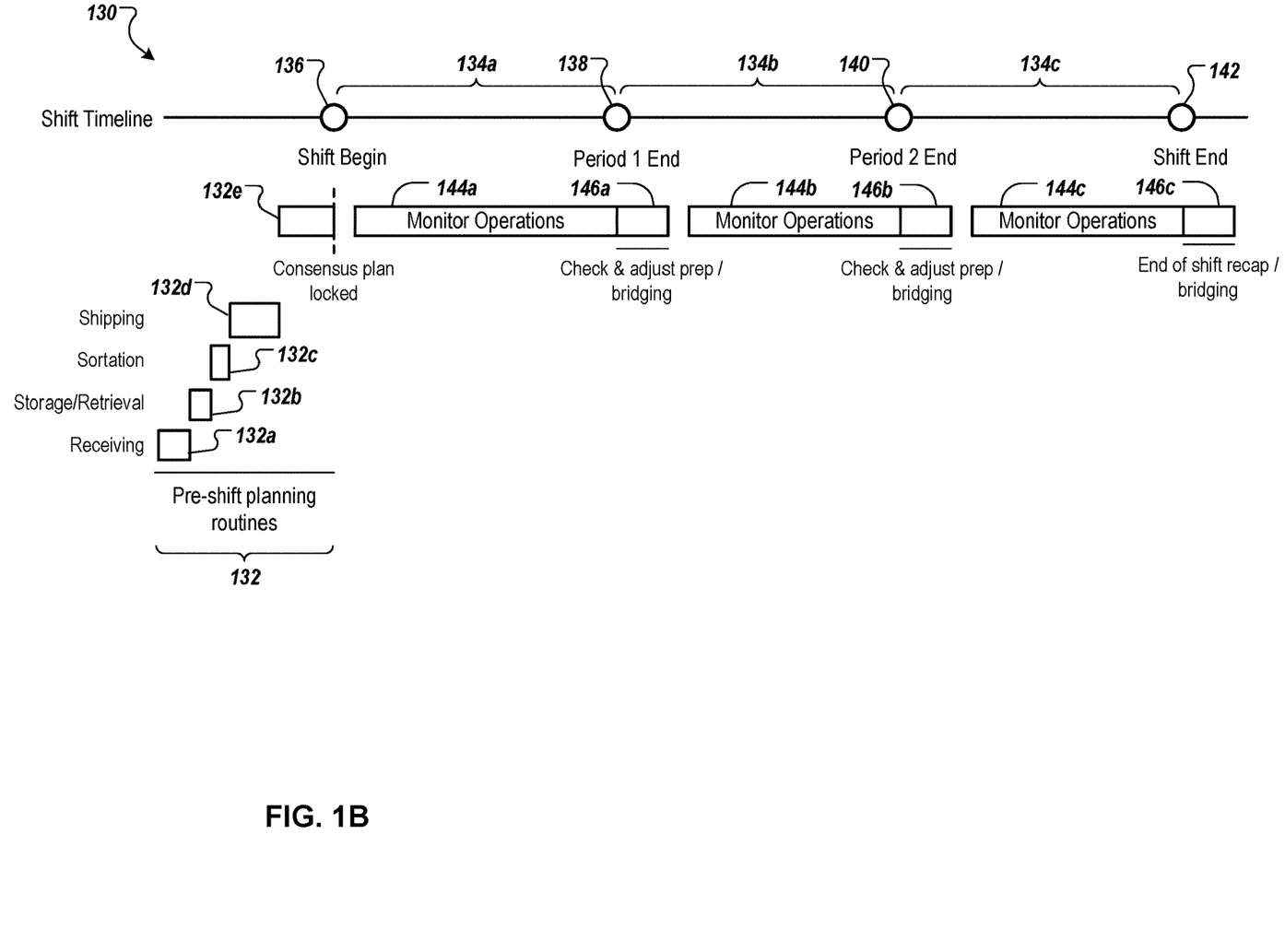
FIG. 1B shows an example shift timeline for warehouse operations.

Referring now to FIG. 1B, an example shift timeline 130 is shown for warehouse operations. A warehouse shift, for example, can be a defined time period (e.g., six hours, eight hours, twelve hours, or another suitable time period) over which various teams (e.g., teams 120a-d, shown in FIG. 1A) perform various operations in a warehouse environment (e.g., warehouse environment 100, also shown in FIG. 1A). In general, warehouse shifts may be divided into multiple different periods having defined start and end times (e.g., organized around breaks). In the present example, the shift timeline 130 includes a pre-shift period 132 during which pre-shift planning routines are performed, and multiple shift periods during which shift operations are performed. A first shift period 134a, for example, begins at time point 136 (e.g., the beginning of the warehouse shift) and ends at time point 138 (e.g., the start of the first break). A second shift period 134b, for example, begins at time point 138 and ends at time point 140 (e.g., the start of the second break). A third shift period 134c, for example, begins at time point 140 and ends at time point 142 (e.g., the end of the warehouse shift).

During the pre-shift period 132, for example, operations managers of various teams (e.g., teams 120a-d, shown in FIG. 1A) can use computing devices (e.g., computing devices 122a-d, also shown in FIG. 1A) to create work plans for their respective teams for the warehouse shift. In the present example, computing device 122a can be used during pre-shift period 132a to create a work plan for the receiving team 120a, computing device 122b can be used during pre-shift period 132b to create a work plan for the storage and retrieval team 120b, computing device 122c can be used during pre-shift period 132c to create a work plan for the sortation team 120c, and computing device 122d can be used during pre-shift period 132d to create a work plan for the shipping team 120d. During pre-shift period 132e, for example, the work plans generated during pre-shift periods 132a-d can be adjusted and aligned by the operations managers of the various different teams 120a-d, such that a consensus plan is locked when the shift begins at time point 136. Example interfaces for creating work plans are described in further detail below. In some implementations, data corresponding to a work plan for a team may be used as input for creating a work plan for another team. For example, data corresponding to a work plan for the receiving team 120a can be used as input for creating a work plan for the storage and retrieval team 120b, data corresponding to a work plan for the storage and retrieval team 120b can be used as input for creating a work plan for the sortation team 120c, and data corresponding to a work plan for the sortation team 120c can be used as input for creating a work plan for the shipping team 120d.

During the warehouse shift (e.g., during an operations monitoring period 144a of the first shift period 134a, an operations monitoring period 144b of the second shift period 134b, and an operations monitoring period 144c of the third shift period 134c), for example, operations performed by various teams (e.g., teams 120a-d, shown in FIG. 1A) can be monitored. In the present example, real-time data that pertains to operations performed by the receiving team 120a in the warehouse environment 100 (shown in FIG. 1A) can be collected (e.g., by data collection devices, such as manual input devices, scanners, cameras, or other suitable devices in the warehouse environment 100), and used to determine progress of the receiving team 120a relative to its work plan for the shift. Similarly, in the present example, real-time data that pertains to operations performed by each of the storage and retrieval team 120b, the sortation team 120c, and the shipping team 120d, can be collected and used to determine progress of the respective team relative to its corresponding work plan for the shift. In general, information related to progress relative to a work plan can be provided to each of the computing devices 122a-d (shown in FIG. 1A) for review by operations managers of the respective teams 120a-d. For example, computing device 122a can be used to present performance monitoring information for the receiving team 120a, computing device 122b can be used to present performance monitoring information for the storage and retrieval team 120b, computing device 122c can be used to present performance monitoring information for the sortation team 120c, and computing device 122d can be used to present performance monitoring information for the shipping team 120d. In some implementations, a different interface may be provided for presenting performance monitoring information for each different team. Example interfaces for presenting performance monitoring information are described in further detail below.

During and/or after the warehouse shift, for example, operations managers of various teams (e.g., teams 120a-d, shown in FIG. 1A) can use computing devices (e.g., computing devices 122a-d, also shown in FIG. 1A) to provide feedback regarding tasks being performed by their respective teams, and can adjust team resources (e.g., workers 114 and/or equipment 116, also shown in FIG. 1A) based on performance monitoring information presented by the computing devices, such that each of the various teams proceeds according to their respective plan. For example, during check & adjust period 146a at the end of the first shift period 134a, and during check & adjust period 146b at the end of the second shift period 134b, an operations manager of the receiving team 120a, an operations manager of the storage and retrieval team 120b, an operations manager of the sortation team 120c, and an operations manager of the shipping team 120d can provide team updates with respect to their various plans using their respective computing devices 122a-d, and can compare work progress with respect to their respective work plans. In general, team resources allocated to an overproducing team may be shifted to an underproducing team. For example, at the check & adjust period 146a, if the receiving team 120a is identified as having overproduced and the storage and retrieval team 120b is identified has having underproduced during the first shift period 134a, team resources may be shifted from the receiving team 120a to the storage and retrieval team 120b. In the present example, by re-allocating resources among teams during the shift, the production of each team 120a-d can better align with their respective work plan for the shift, thus improving coordination among the teams and increasing overall production throughout the warehouse environment 100. During an end of shift recap period 146c, for example, operations managers of the teams 120a-d can use performance monitoring information presented by the computing devices 122a-d to evaluate overall performance of the teams with respect to their plans, to identify root causes of problems that may have occurred during the shift, and to potentially improve various warehouse processes.

Referring again to FIG. 1A, for example, the system 150 for generating warehouse process plans and coordinating warehouse operations can include various computing servers 160 and data sources 162. In some examples, the computing servers 160 can represent various forms of servers, including but not limited to network servers, web servers, application servers, or other suitable computing servers. In some examples, the data sources 162 can represent databases, file systems, and/or cached data sources. The computing servers 160, for example, can access data from the data sources 162, can execute software that processes the accessed data, and can provide information based on the accessed data to the computing devices 122a-d. Communications between the computing servers 160, the computing devices 122a-d, and various data collection devices (not shown) in the warehouse environment 100, for example, can occur over one or more communication networks (not shown), including a LAN (local area network), a WAN (wide area network), and/or the Internet. In the present example, the computing servers 160 and the data sources 162 can be used to implement a warehouse coordination system, which is described in further detail with respect to FIG. 2.

Figure 2:
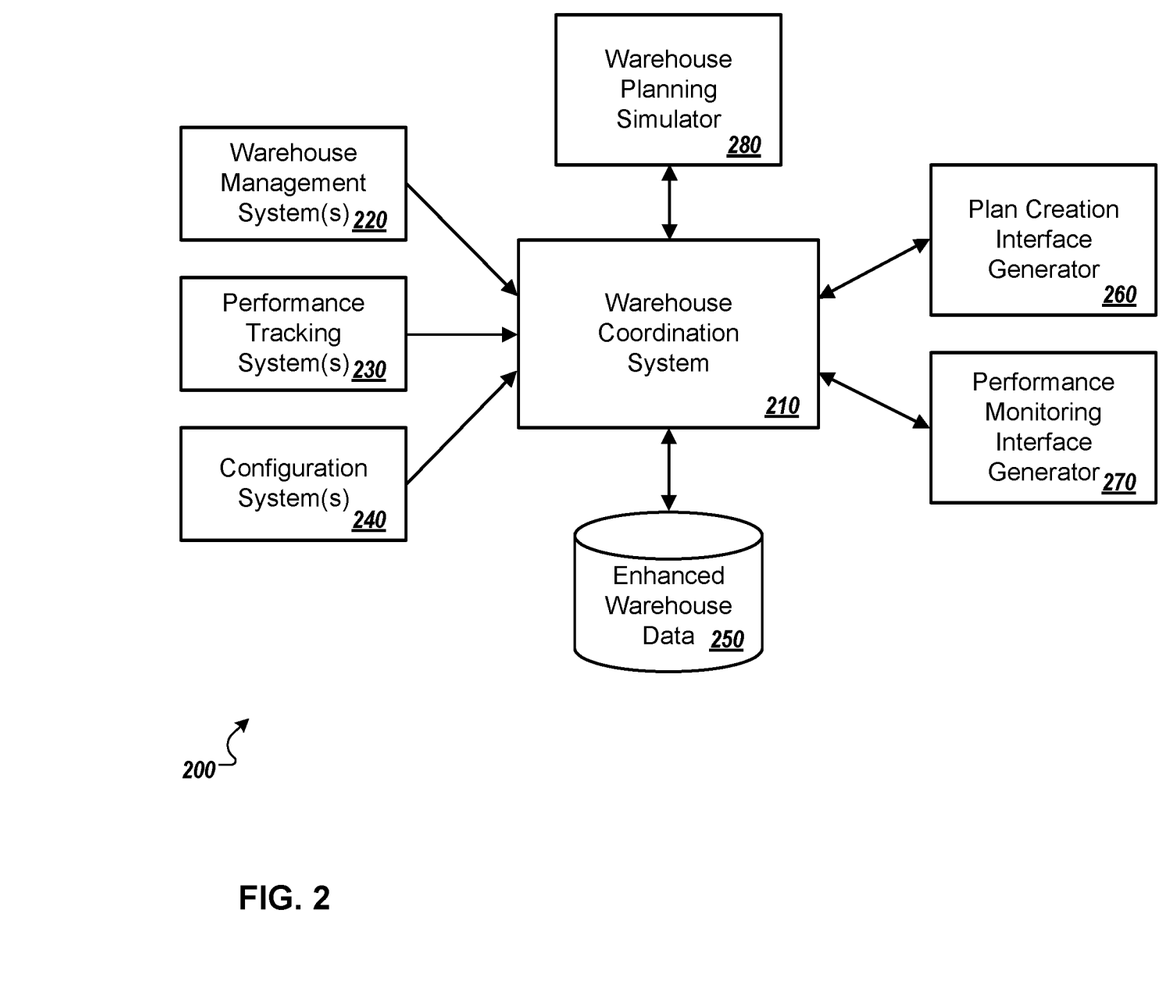
FIG. 2 depicts an example system for generating warehouse process plans and coordinating warehouse operations.

Referring now to FIG. 2, an example system 200 for generating warehouse process plans and coordinating warehouse operations is depicted. The system 200 in the present example includes a warehouse coordination system 210 that receives data (e.g., using a data collection component) from one or more warehouse management systems 220, performance tracking systems 230, and configuration systems 240. The warehouse management system(s) 220, for example, can provide real-time information related to a state of the warehouse environment 100 (shown in FIG. 1A). For example, the warehouse management system(s) 220 can provide information related to containers of goods that have been received and are waiting to be placed in the storage area 110 (shown in FIG. 1A). As another example, the warehouse management system(s) 220 can provide information related to requests for goods that are to be picked from the storage area 110 and that are to be loaded into containers 106 (shown in FIG. 1A) and sent to a retail store. As containers 106 and/or goods in the warehouse environment 100 are involved in a warehouse operation (e.g., receipt, transport, put away, pick, repackaging, shipment, etc.), for example, real-time operation data (e.g., including an operation timestamp and various identifiers related to the operation, such as location, worker, team, equipment, container, and/or goods identifiers), can be collected and stored by the warehouse management system(s) 220. The performance tracking system(s) 230, for example, can maintain and provide data related to historical performance of various warehouse equipment, workers, and/or teams. For example, the performance tracking system(s) 230 can provide data that indicates productivity rates (e.g., a number of warehouse operations per time period over a defined time range, such as over a previous week, month, quarter, etc.) of warehouse equipment, workers, and/or teams, such that productivity of current combinations of equipment, workers, and/or teams can be projected over a current shift. The configuration system(s) 240, for example, can maintain and provide data related to a configuration (e.g., physical layout, processing capabilities, available equipment, etc.) of the warehouse environment 100. Data received from the warehouse management system(s) 220, the performance tracking system(s) 230, and/or the configuration system(s) 240, for example, can be combined and stored in an enhanced warehouse data source 250 for use by the warehouse coordination system 210.

In the present example, the warehouse coordination system 210 can include and/or communicate with a plan creation interface generator 260, a performance monitoring interface generator 270, and a warehouse planning simulator 280. The plan creation interface generator 260, for example, can be used by the warehouse coordination system 210 to generate respective plan creation interfaces for presentation on each of the computing devices 122a-d (shown in FIG. 1A) when requested during the pre-shift period 132 (shown in FIG. 1B). The performance monitoring interface generator 270, for example, can be used by the warehouse coordination system 210 to generate respective performance monitoring interfaces for presentation on each of the computing devices 122a-d when requested during any of the shift periods 134a-c and/or during the end of shift recap period 146c (shown in FIG. 1B). The warehouse planning simulator 280, for example, can be used by the warehouse coordination system 210 (e.g., as part of a plan creation process) to run granular, discrete process simulations for operations to be performed by a team during a shift.

Figure 3:
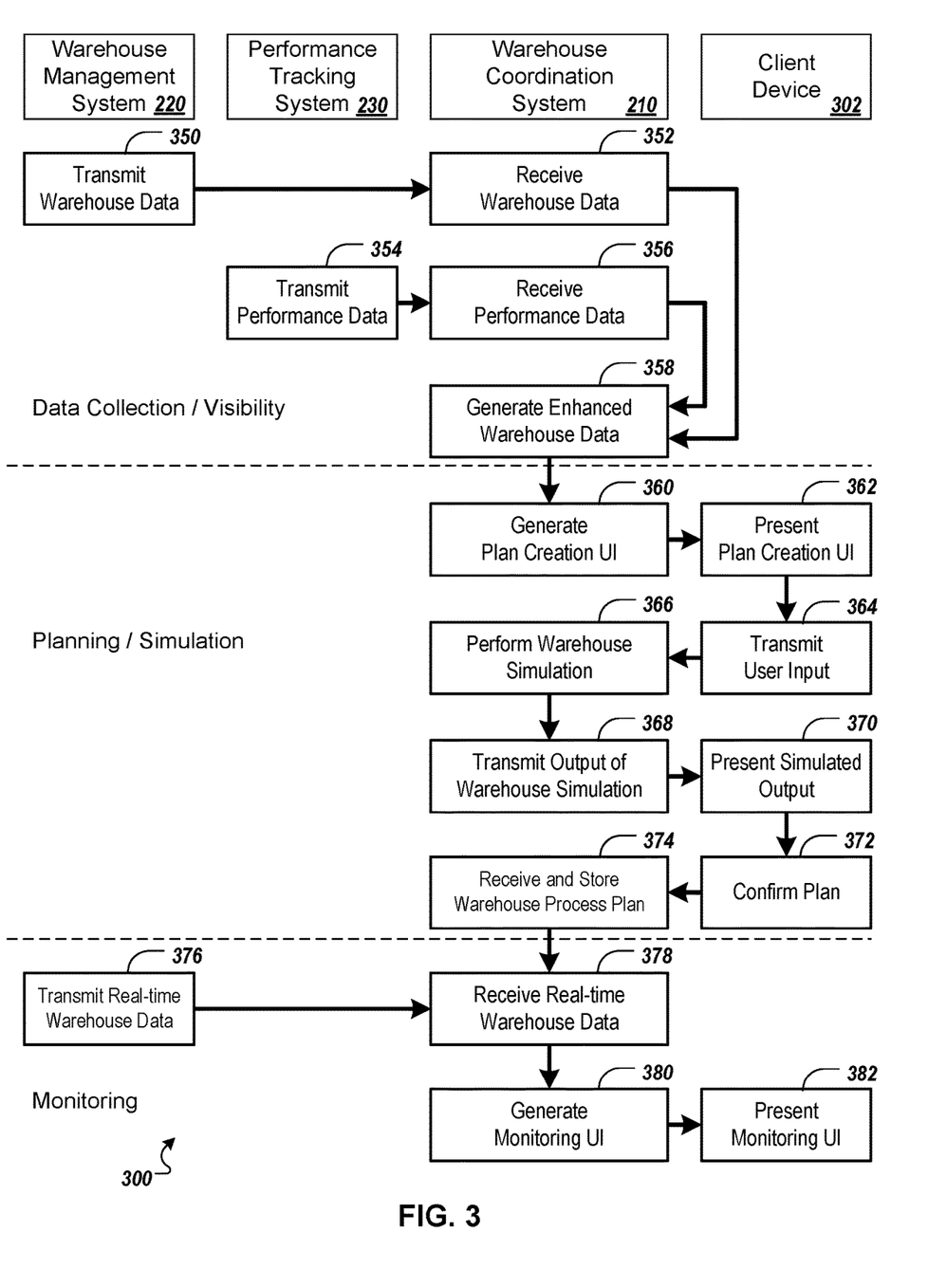
FIG. 3 is a flow diagram of an example technique for generating warehouse process plans and coordinating warehouse operations.

Referring now to FIG. 3, a flow diagram of an example technique 300 for generating warehouse process plans and coordinating warehouse operations is shown. In general, the example technique 300 includes data collection and visibility operations, planning and simulation operations, and monitoring operations that can be performed by various components of the system 200 (shown in FIG. 2) for generating warehouse process plans and coordinating warehouse operations. In the present example, the example technique 300 can be performed by the warehouse coordination system 210 (e.g., also shown in FIG. 2), the warehouse management system 220 (e.g., also shown in FIG. 2), the performance tracking system 230 (e.g., also shown in FIG. 2), the configuration system(s) 240 (e.g., also shown in FIG. 2) and a client device 302 (e.g., similar to any of the computing devices 122a-d, shown in FIG. 1A).

At 350, the warehouse management system 220 transmits warehouse data, and at 352, the warehouse coordination system 210 receives the warehouse data. Before, after, or concurrently, at 354, the performance tracking system 230 transmits performance data, and at 356, the warehouse coordination system 210 receives the performance data. Optionally, the configuration system(s) 240 (shown in FIG. 2) can transmit configuration data, and the warehouse coordination system 210 can receive such data. Referring to FIG. 1A, for example, during stage (A), the computing server(s) 160 (e.g., one or more computing servers for implementing components of the system 200) can receive warehouse, performance, and/or configuration data 170. The data 170, for example, can pertain to a current state of the warehouse environment 100, historical performance of various warehouse resources (e.g., equipment, workers, and/or teams), and/or a configuration of the warehouse environment and/or resources. Warehouse data received from the warehouse management system 220, for example, can include data related to current locations and contents of containers of goods in the warehouse environment 100, work that is to be performed in the warehouse environment 100 (e.g., goods to be received, moved, and/or sent), worker, teams, and equipment employed in the warehouse environment, and other relevant data for managing warehouse operations during a shift. Performance data received from the performance tracking system 230, for example, can include data related to historical performance (e.g., productivity statistics) of various equipment, workers, and/or teams in the warehouse environment 100. Configuration data received from the configuration system(s) 240, can pertain to a configuration of the warehouse environment 100.

At 358, the warehouse coordination system 210 generates enhanced warehouse data, based on the received warehouse data, performance data, and configuration data. Referring to FIG. 1A, for example, during stage (B), the computing server(s) 160 can generate enhanced data 172 based on the received warehouse/performance/configuration data 170, and can maintain the enhanced data 172 in data source(s) 162 (e.g., similar to the enhanced warehouse data source 250, shown in FIG. 2). For detailed and accurate planning, for example, neither warehouse data from the warehouse management system 220, nor performance data from the performance tracking system 230, nor configuration data from the configuration system(s) 240 may be entirely sufficient. For example, the warehouse data may include data related work tasks to be performed over a shift, but may lack data related to the performance capabilities of equipment, workers, and/or teams that perform the work tasks, and an environment in which the work tasks are performed. The performance data, for example, may include data related to performance capabilities, but may lack data related to work tasks to be performed. In general, generating the enhanced data 172 can include techniques for mapping performance capabilities of available equipment, workers, and/or teams to a backlog of work tasks to be performed, with respect to a particular environment. By generating and maintaining the enhanced data 172 in the data source(s) 162, and using the enhanced data for plan creation, work simulation, and progress monitoring applications, for example, load on the warehouse management system 220 and the performance tracking system 230 can be reduced. Further, by combining and cross-referencing data from the systems 220, 230, and 240, and preparing the data for use by the plan creation, work simulation, and progress monitoring applications, resources of the warehouse coordination system 210 can be conserved.

In some implementations, data related to performance capabilities may include productivity rates (e.g., a number of warehouse operations per time period) of various warehouse resources (e.g., equipment, workers, and/or teams or portions of teams). For example, performance data from the performance tracking system 230 can indicate that over a defined time range (e.g., the previous week, two weeks, four weeks, eight weeks, or another suitable time range), a team or a portion of a team (e.g., a specific picking team of the storage and retrieval team 120*b*, shown in FIG. 1A) has historically performed at a particular productivity rate (e.g., 250 cartons per hour) when picking a particular type of container (e.g., conveyable containers) from the storage area 110 (shown in FIG. 1A). When generating a production plan for the team, the performance data can be applied to work tasks to be performed to predict how many of the work tasks may be accomplished by the team during a shift. In some implementations, generating enhanced warehouse data may include attributing particular warehouse resources to warehouse tasks that have been and/or are being performed. For example, the warehouse management system 220 may store data that indicates that a warehouse task has been performed (e.g., a particular container of goods has been received at a particular time), but may lack data that indicates which warehouse resources performed the warehouse task. By attributing warehouse resources to warehouse tasks, for example, performance capabilities of various resources may be more readily determined.

In some implementations, generating enhanced warehouse data may include using configuration data that indicates how a warehouse is operationally and physically configured. For example, the data source(s) 162 (shown in FIG. 1A) can receive, maintain, and use data that maps areas of the warehouse environment 100 (shown in FIG. 1A) to various warehouse resources (e.g., equipment, workers, and/or teams or portions of teams) that are designated as being assigned to operate in the areas. As another example, the data source(s) 162 can use data that maps various warehouse resources and/or warehouse areas (e.g., one or more docks 102, shown in FIG. 1A) that are designated as being capable of handling containers 106 (shown in FIG. 1A) having particular properties (e.g., conveyable cartons, non-conveyable cartons, etc.). Based on the performance data and the configuration data, for example, a data linkage between work tasks to be performed during a shift, resources for performing the work tasks, and predicted productivities of the resources can be determined.

At 360, the warehouse coordination system 210 can use the plan creation interface generator 260 (shown in FIG. 2) to generate and provide data for a plan creation user interface. Referring to FIG. 1A, for example, during stage (C), the computing server(s) 160 can generate and provide data for plan creation user interface 180, for presentation and use by any of the computing devices 122*a-d*, shown in FIG. 1A). In general, the plan creation user interface 180 can be used by an operations manager of one of the teams 120*a-d* for creating a feasible work plan for their respective team, the work plan specifying work tasks to be accomplished by the team during a particular shift. In some implementations, a work plan may be optimized according to various optimization criteria (e.g., time, throughput, resources, etc.). For example, the plan creation user interface 180 can provide suggested sequencing and/or resource application values such that the work plan is optimized according to the criteria.

At 362, the plan creation user interface is presented by the client device 302 (e.g., similar to any of the computing devices 122*a-d*, shown in FIG. 1A). In general, plan creation interfaces may include multiple different screens which can be presented according to an application flow, in which an operations manager selects work tasks for their team to perform during a shift, the work tasks are sequenced, and resources (e.g., equipment, workers, and/or teams or portions of teams) are applied to the work. Once resources have been applied to the work tasks, for example, the work tasks can be simulated, and simulation results of performing the work tasks can be presented to the operations manager. If the simulation results are acceptable, for example, the operations manager may certify and submit a work plan that includes the selected, sequenced, and staffed work tasks. In some implementations, a different interface may be provided for creating work plans for each different team. For example, a receiving plan creation interface can be provided on computing device 122*a* for creating a work plan for the receiving team 120*a*, a storage and retrieval plan creation interface can be provided on computing device 122*b* for creating a work plan for the storage and retrieval team 120*b*, a sortation plan creation interface can be provided on computing device 122*c* for creating a work plan for the sortation team 120*c*, and a shipping plan creation interface can be provided on computing device 122*d* for creating a work plan for the shipping team 120*d*.

At 364, user input provided using the plan creation user interface is transmitted by the client device 302 for receipt by the warehouse coordination system 210. Referring to FIG. 1A, for example, the plan creation interface 180 can include a work task input interface 182 through which an operations manager (e.g., a manager of one of the teams 120*a-d*) can use various interface controls to select and sequence work tasks to be performed by their team during a shift, and to apply resources (e.g., equipment, workers, and/or teams or portions of teams) to the work tasks. In some implementations, at least a portion of the enhanced warehouse data can be presented on a plan creation user interface for a warehouse process. For example, the work task input interface 182 can present a list of work tasks that are available to be performed by a particular team during a particular shift (e.g., available work and/or work in progress, based on the enhanced data 172), and the operations manager can select from and sequence the available tasks. To assist the operations manager with applying resources to the work tasks, for example, the work task input interface 182 can present information related to resources that are available to the team during the shift (e.g., resource functions, productivity rates, and/or other relevant information, based on the enhanced data 172). Selection and sequencing of work tasks and application of the resources can be performed based on priority information presented along with the tasks, process guidelines of an organization, and/or expert knowledge of the operations manager, for example. In the present example, after the operations manager has selected and sequenced tasks (e.g., Task A, Task B, and Task C) to be performed by resources of their team (e.g., one of the teams 120*a-d*) during the shift, the operations manager can submit the selected, sequenced, and staffed work tasks for simulation by the computing server(s) 160, and can provide a command to run a simulation of performing the tasks by selecting the simulation control 184 of the work task input interface 182.

In response to receiving the user input and the simulation command, at 366, the warehouse coordination system 210 performs a simulation of the tasks to be performed over the shift for the warehouse process, according to the user inputs. For example, the warehouse coordination system 210 can receive from the client device 302 (e.g., similar to one of the computing devices 122*a-d*, shown in FIG. 1A) a data structure that includes data that indicates the selected, sequenced, and staffed work tasks input by the operations manager using the plan creation interface 180 (shown in FIG. 1), and can use the warehouse planning simulator 280

(shown in FIG. 2) to run a granular, discrete process simulation of the work tasks being performed in the warehouse environment 100 (shown in FIG. 1A). Running the process simulation, for example, can include modeling the selected work tasks according to the assigned sequence and the applied resources over time, using a collection of state variables that represent a current state of various warehouse entities (e.g., vehicles, equipment, workers, containers, products, etc.) within the warehouse environment 100. The state variables, for example, can be modified by the simulation to model an evolution of the state of the various warehouse entities over time.

At 368, the warehouse coordination system 210 transmits an output of the simulation of the tasks to be performed over the shift for the warehouse process, and at 370, the client device 302 presents the simulated output. Referring to FIG. 1A, for example, the plan creation interface 180 can include a simulation output interface 186 through which the operations manager can review the output of the simulation of the tasks (e.g., predicted throughput of a team over a shift when performing the warehouse process according to the specified plan). If the output is not acceptable, for example, the operations manager can again use the work task input interface 182 to adjust the work plan (e.g., by selecting different tasks, resequencing the tasks, and/or assigning different resources to the tasks), and can provide a command to run a simulation of the adjusted work plan. By experimenting with various different task, sequence, and resource scenarios, for example, operations managers can efficiently generate and refine feasible work plans for their respective teams. When the output is determined by the operations manager as being acceptable, for example, the operations manager can confirm and submit the work plan for his or her team for possible inclusion in an overall plan for a shift. In the present example, at 372 the work plan is confirmed and submitted by the operations manager at 372, who provides a command to confirm and submit the work plan by selecting the submission control 188 of the simulation output interface 186.

At 374, the warehouse coordination system 210 receives and stores the simulated warehouse process plan that specifies the tasks to be performed over the shift. Referring to FIG. 1A, for example, the computing server(s) 160 can store the plan in data source(s) 162, along with simulated output corresponding to the plan, and along with simulated plans/output for other warehouse teams 120a-d.

At 376, the warehouse management system 220 transmits real-time warehouse data, and at 378, the warehouse coordination system 210 receives the real-time warehouse data. Referring to FIG. 1A, for example, during stage (D), the computing server(s) 160 can receive real-time data 174 that pertains to work tasks being performed over the shift for the warehouse process in the warehouse environment 100. Real-time data provided by the warehouse management system 220, for example, can include data related to updated locations and/or contents of containers of goods in the warehouse environment 100, updated locations of equipment and/or workers in the warehouse environment 100, specific work tasks being performed by the equipment and/or workers, or other relevant real-time data. In some implementations, real-time data can be periodically or continually provided and received during a shift. For example, the warehouse management system 220 can periodically (e.g., once per minute, once every five minutes, once every fifteen minutes, or at another suitable time interval) provide updated batches of warehouse state data for receipt by the warehouse coordination system 210. As another example, the warehouse management system 220 can provide updated warehouse state data for receipt by the warehouse coordination system 210 as changes to the warehouse state occur.

At 380, the warehouse coordination system 210 can use the performance monitoring interface generator 270 (shown in FIG. 2) to generate and provide data for a performance monitoring user interface. Referring to FIG. 1A, for example, during stage (E), the computing server(s) 160 can generate and provide data for performance monitoring user interface 190. In general, the performance monitoring user interface 190 can be used by an operations manager of one of the teams 120a-d for comparing actual work progress during a shift according to real-time data, relative to predicted work progress during the shift according to the performed simulation of work tasks included in the warehouse process plan.

At 382, the performance monitoring user interface is presented by the client device 302 (e.g., similar to any of the computing devices 122a-d, shown in FIG. 1A). In general, performance monitoring user interfaces can include various numeric and/or graphical indications of actual work progress for a team during a shift, relative to predicted work progress for the team. In the present example, the performance monitoring user interface 190 includes a predicted work progress indicator 192 and an actual work progress indicator 194. The predicted work progress indicator 192, for example, represents work tasks that have been predicted to be performed by the team over the shift, according to the simulated warehouse process plan. The actual work progress indicator 194, for example, represents actual work tasks that have been performed by the team over the shift. As shown in the present example, the team overperformed during the first portion of the shift, then adjusted its performance (e.g., possibly as a result of a reallocation of resources prompted in one of the check & adjust periods 146a-b) such that its rate of performing work tasks was more closely aligned with its warehouse process plan. By aligning the actual production of teams to their respective production plans, for example, process bottlenecks and physical congestion can be reduced in the warehouse environment 100, improving overall efficiency across the various teams 120a-d. In some implementations, a different interface may be provided for presenting performance monitoring information for each different team. For example, a receiving performance monitoring interface can be provided on computing device 122a for monitoring performance of the receiving team 120a, a storage and retrieval performance monitoring interface can be provided on computing device 122b for monitoring performance of the storage and retrieval team 120b, a sortation performance monitoring interface can be provided on computing device 122c for monitoring performance of the sortation team 120c, and a shipping performance monitoring interface can be provided on computing device 122d for monitoring performance of the shipping team 120d.

Figure 4:
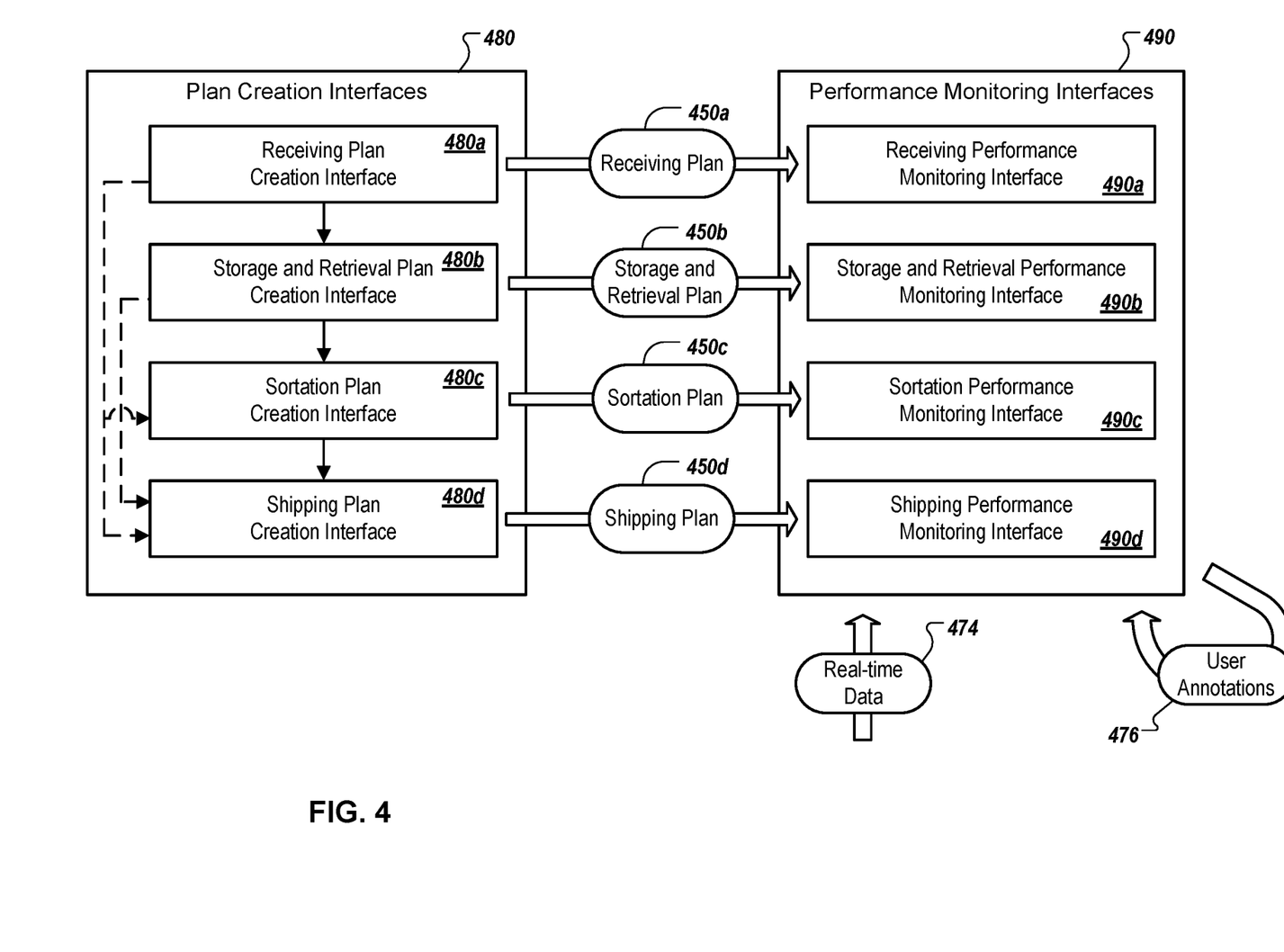
FIG. 4 shows example data interactions between warehouse process plan creation interfaces and warehouse performance monitoring interfaces.

Referring now to FIG. 4, example data interactions between warehouse process plan creation interfaces 480 and warehouse performance monitoring interfaces 490 are shown. Each of the plan creation interfaces 480 (e.g., similar to the plan creation interface 180, shown in FIG. 1A), for example, can be presented by a different computing device (e.g., one of the computing devices 122a-d, shown in FIG. 1A) used by an operation manager of a different team (e.g., one of the teams 120a-d, shown in FIG. 1A) to create a warehouse process plan for their respective team. In the present example, the plan creation interfaces 480 include a receiving plan creation interface 480a for creating a receiving plan 450a for the receiving team 120a, a storage and retrieval plan creation interface 480b for creating a storage and retrieval plan 450b for the storage and retrieval team 120b, a sortation plan creation interface 480c for creating a sortation plan 450c for the sortation team 120c, and a shipping plan creation interface 480d for creating a shipping plan 450d for the shipping team 120d.

In general, use of and interactions between the plan creation interfaces 480a-d can reflect operational workflow in a warehouse environment. For example, containers of goods in the warehouse environment 100 can generally be processed sequentially by the teams 120a-d, such that the containers are initially received by the receiving team 120a, are then handled by the storage and retrieval team 120b, are then optionally processed by the sortation team 120c, and are eventually shipped by the shipping team 120d. As shown in FIG. 4, and as shown in the shift timeline 130 of FIG. 1B, for example, the plan creation interfaces 480 can also be used sequentially to reflect the operational workflow, such that output resulting from simulation of planned work tasks of a first team is used as input for creating a work plan for a second team, after the work plan for the first team is confirmed and submitted by the first team's operations manager. In the present example, output resulting from simulation of planned work tasks for the receiving team 120a can be used as input for creating a work plan for the storage and retrieval team 120b, output resulting from simulation of planned work tasks for the storage and retrieval team 120b can be used as input for creating a work plan for the sortation team 120c, and output resulting from simulation of planned work tasks for the sortation team 120c can be used as input for creating a work plan for the shipping team 120d. In some implementations, output resulting from simulation of planned work tasks for an upstream team can be used as input for creating a work plan for any downstream team. For example, output resulting from simulation of planned work tasks for the receiving team 120a can be used as input for creating a work plan for the storage and retrieval team 120b, the sortation team 120c, and the shipping team 120d. Similarly, for example, output resulting from simulation of planned work tasks for the storage and retrieval team 120b can be used as input for creating a work plan for the sortation team 120c and the shipping team 120d. By cascading output generated using plan creation interfaces as input into other plan creation interfaces, for example, warehouse simulation processes can be simplified (e.g., by limiting the number of process variables), while promoting collaboration between the various teams.

In general, the performance monitoring interfaces 490 can be used to compare real-time work progress for various warehouse processes to simulated work plans. Real-time work progress, for example, can be determined based on real-time data 474 (e.g., similar to the real-time data 174, shown in FIG. 1A). Each of the performance monitoring interfaces 490 (e.g., similar to the performance monitoring interface 190, shown in FIG. 1A), for example, can be presented by a different computing device (e.g., one of the computing devices 122a-d, shown in FIG. 1A) used by an operation manager of a different team (e.g., one of the teams 120a-d, shown in FIG. 1A) to monitor performance of their respective team. In the present example, the performance monitoring interfaces 490 include a receiving performance monitoring interface 490a for monitoring performance of the receiving team 120a relative to the receiving plan 450a, a storage and retrieval performance monitoring interface 490b for monitoring performance of the storage and retrieval team 120b relative to the storage and retrieval plan 450b, a sortation performance monitoring interface 490c for monitoring performance of the sortation team 120c relative to the sortation plan 450c, and a shipping performance monitoring interface 490d for monitoring performance of the shipping team 120d relative to the shipping plan 450d.

In some implementations, performance monitoring interfaces may include mechanisms for receiving feedback based on observations related to real-time work progress for various warehouse processes relative to simulated work plans. For example, each of the performance monitoring interfaces 490a-d can include one or more controls for providing user annotations 476 (e.g., comments, markup, ratings, etc.) that are used to update the respective interface 490a-d (and, optionally, one or more other interfaces 490a-d). The user annotations 476, for example, can provide context for reported productivity metrics, and can be shared among various operations managers to help identify root causes of potential problems within the warehouse environment 100 and to help make collective decisions.

Figure 5:
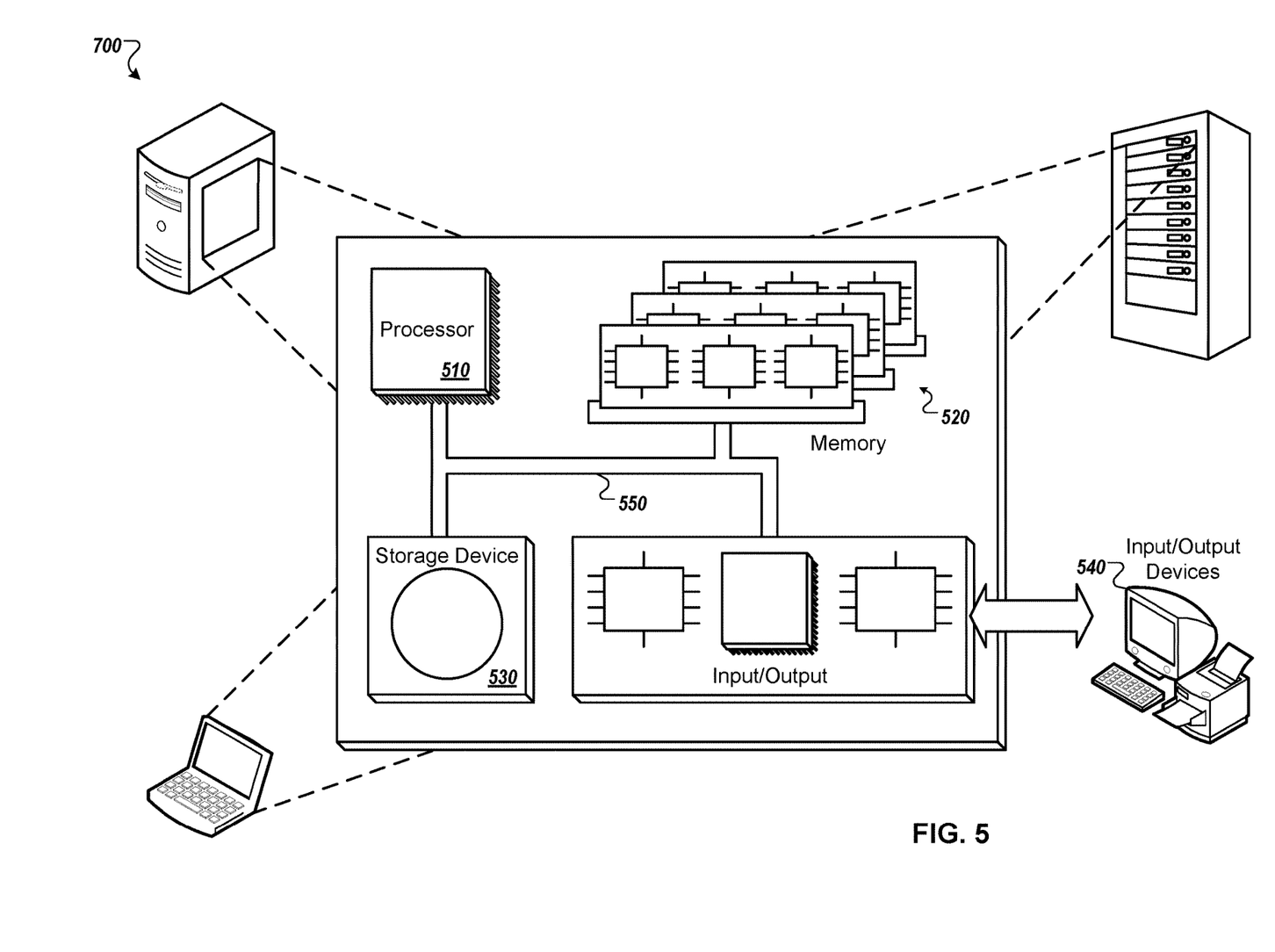
FIG. 5 is a schematic diagram that shows an example of a computing system.

FIG. 5 is a schematic diagram that shows an example of a computing system 500. The computing system 500 can be used for some or all of the operations described previously, according to some implementations. The computing system 500 includes a processor 510, a memory 520, a storage device 530, and an input/output device 540. Each of the processor 510, the memory 520, the storage device 530, and the input/output device 540 are interconnected using a system bus 550. The processor 510 is capable of processing instructions for execution within the computing system 500. In some implementations, the processor 510 is a single-threaded processor. In some implementations, the processor 510 is a multi-threaded processor. The processor 510 is capable of processing instructions stored in the memory 520 or on the storage device 530 to display graphical information for a user interface on the input/output device 540.

The memory 520 stores information within the computing system 500. In some implementations, the memory 520 is a computer-readable medium. In some implementations, the memory 520 is a volatile memory unit. In some implementations, the memory 520 is a non-volatile memory unit.

The storage device 530 is capable of providing mass storage for the computing system 500. In some implementations, the storage device 530 is a computer-readable medium. In various different implementations, the storage device 530 may be a floppy disk device, a hard disk device, an optical disk device, or a tape device.

The input/output device 540 provides input/output operations for the computing system 500. In some implementations, the input/output device 540 includes a keyboard and/or pointing device. In some implementations, the input/output device 540 includes a display unit for displaying graphical user interfaces.

Some features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM (erasable programmable read-only memory), EEPROM (electrically erasable programmable read-only memory), and flash memory devices; magnetic disks such as internal hard disks and removable disks; magneto-optical disks; and CD-ROM (compact disc read-only memory) and DVD-ROM (digital versatile disc read-only memory) disks. The processor and the memory can be supplemented by, or incorporated in, ASICs (application-specific integrated circuits).

To provide for interaction with a user, some features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

Some features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN (local area network), a WAN (wide area network), and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

What is claimed is:

1. A computer-implemented system for coordinating operations and improving efficiency in a warehouse environment, the system comprising:
    memory storing instructions;
    one or more processors configured to execute the instructions, wherein execution of the instructions causes the one or more processors to provide:
        one or more warehouse management systems that are configured to store, maintain, and serve warehouse data that represents a current state of a warehouse, including data representing containers of goods within the warehouse, tasks to be performed within the warehouse related to the current state of the warehouse, and currently available equipment, workers, and teams within the warehouse;
        one or more performance tracking systems that are configured to store, maintain, and serve performance data that represents historical performance of the currently available equipment, workers, and teams within the warehouse;
    a first computing device comprising memory storing instructions, one or more processors, and a display, wherein the one or more processors of the first computing device are configured to provide a series of user interfaces for a first warehouse process on the display of the first computing device when executing the instructions stored in the memory of the first computing device;
    a second computing device comprising memory storing instructions, one or more processors, and a display, wherein the one or more processors of the second computing device are configured to provide a series of user interface for a second warehouse process that is downstream from the first warehouse process on the display of the second computing device when executing the instructions stored in the memory of the second computing device;
    data collection devices that each comprise a processor, memory, and communication interfaces that are positioned throughout the warehouse and configured to automatically collect real-time warehouse data that indicates (i) tasks being performed in the warehouse environment, (ii) containers of goods to which the tasks are being performed, and (iii) location data identifying interior locations at which the container of goods are currently located, wherein at least one of the data collection devices comprises cameras that are configured to capture images of the container of goods being handled in the warehouse environment from which the real-time warehouse data is generated;
    automated guided vehicles that are configured to perform physical tasks in the warehouse environment according to instructions;
    an enhanced warehouse database that is configured to cache enhanced warehouse data that maps (i) performance capability data that represents the currently available equipment, workers, and teams with (ii) backlog task data that represents a current backlog of tasks for the warehouse, wherein the cached enhanced warehouse data is configured to reduce the computational load on the warehouse management systems and the performance tracking systems, and to conserve computational and network resources of a warehouse coordination system, wherein the currently available equipment includes the automated guided vehicles; and
    the warehouse coordination system comprising one or more processors and computer-readable memory storing instructions that, when executed by the one or more processors, cause the one or more processors to perform operations to automatically distribute physical items from a warehouse to a retail store in response to conditions in the retail stores indicating a need for the physical items, the operations comprising:
        receiving information related to inventory in the retail store, determining that the retail store has a need for the physical items, and automatically performing the following operations to cause physical distribution of the physical items from the warehouse to the retail store based on the need being determined:
receiving, from the one or more warehouse management systems, current warehouse data that represents the current state of a warehouse;
receiving, from the one or more performance tracking systems, current performance data that represents historical performance of the currently available equipment, workers, and teams, including the automated guided vehicles and other equipment, in the warehouse;
updating the cache of the enhanced warehouse data in the enhanced warehouse database by generating a mapping of the current performance capabilities of the currently available equipment, workers, and teams in the warehouse as indicated by the current performance data, to a current backlog of tasks to be performed in the warehouse over a current shift as indicated by the current warehouse data;
providing, to the first computing device and using the cached enhanced warehouse data in the enhanced warehouse database, data for a first plan creation user interface for the first warehouse process, wherein the data for the first plan creation user interface includes at least a portion of the enhanced warehouse data, wherein the first computing device presents the first plan creation user interface for the first warehouse process, and wherein the first plan creation user interface includes interface controls for (i) presenting a portion of the backlog of tasks that are available to be performed over the shift for the first warehouse process (ii) selecting and sequencing tasks from the portion of the backlog of tasks, (iii) applying workers to selected and sequenced tasks, and (iv) providing a command to perform a simulation of the selected and sequenced tasks;
receiving, through the first plan creation user interface, (i) user input that indicates a user selection and sequencing of available tasks to be performed over the shift for the first warehouse process, and a user selection of workers to be applied to the selected and sequenced tasks, and (ii) a simulation command to perform a simulation of the selected and sequenced tasks to be performed over the shift for the first warehouse process, based at least in part on performance capabilities of the applied workers;
in response to receiving the user input and the simulation command through the first plan creation user interface:
  performing, using the cached enhanced warehouse data in the enhanced warehouse database, the simulation of the selected and sequenced tasks to be performed by the selected workers over the shift for the first warehouse process, according to the user input, by modeling the selected tasks to be performed by the selected workers over the shift according to the sequence, using a collection of state variables that represent the selected workers and containers of goods in the warehouse,
  determining, using the cached enhanced warehouse data in the enhanced warehouse database, an output of the simulation of the selected and sequenced tasks to be performed by the selected workers over the shift for the first warehouse process, and
  providing, to the first computing device, the output of the simulation wherein the first computing device presents a simulation output interface that includes the output of the simulation, and wherein the simulation output interface provides (i) a first option to adjust the user input that indicates the user selection and sequencing of available tasks to be performed over the shift for the warehouse process, and the user selection of workers to be applied to the selected and sequenced tasks, and (ii) a second option to submit a work plan for the first warehouse process that corresponds to the user input;
after receiving a user selection of the second option through the simulation output interface, providing, to the second computing device and using the cached enhanced warehouse data in the enhanced warehouse database, at least a portion of the output of the simulation of the selected and sequenced tasks to be performed by the selected workers over the shift for the first warehouse process, wherein the second computing device presents a second plan creation user interface for the second warehouse process that is downstream from the first warehouse process, and wherein the second plan creation user interface includes user interface controls for (i) presenting tasks that are available to be performed over the shift for the second warehouse process, based on the output of the simulation for the first warehouse process, (ii) selecting and sequencing tasks from the presented tasks, (iii) applying workers to selected and sequenced tasks, and (iv) providing a command to perform a simulation of a performance of the selected and sequenced tasks of the second warehouse process by the applied workers;
receiving, through the second plan creation user interface, (i) user input that indicates workers to be applied to tasks to be performed over the shift for the second warehouse process, and (ii) a simulation command to perform a simulation of the tasks to be performed over the shift for the second warehouse process;
in response to receiving the user input and the simulation command through the second plan creation user interface, performing, using the cached enhanced warehouse data in the enhanced warehouse database, the simulation of the tasks to be performed over the shift for the second warehouse process;
after performing the simulation of the tasks to be performed over the shift for the first warehouse process and the second warehouse process, storing, in the cache of the enhanced warehouse database, a first warehouse process plan that specifies first tasks to be performed over the shift for the first warehouse process and a second warehouse process plan that specifies second tasks to be performed over the shift for the second warehouse process;
providing, by the warehouse coordination system and for use in performing the first and second tasks by the automated guided vehicles and by other equipment and workers in the warehouse over the shift, the first warehouse process plan and the second warehouse process plan, wherein providing the first warehouse process plan causes the first tasks to be performed by a first team within the warehouse comprising a first subset of the automated guided vehicles, other equipment, and workers, wherein providing the second warehouse process plan causes the second tasks to be performed by a second team within the warehouse comprising a second subset of the automated guided vehicles, other equipment, and workers, wherein the first and second tasks are different from each other, wherein the first and second teams are different from each other, wherein performing the first and second tasks comprises transmitting instructions to the first subset of the automated guided vehicles and the second subset of the automated guided vehicles that cause the first subset of the automated guided vehicles and the second subset of the automated guided vehicles to physically perform the first tasks and the second tasks to move and distribute physical items comprising the goods distributed from the warehouse to the retail store;

during the shift and after providing the first and second tasks, performing an iterative feedback loop comprising monitoring, reporting, and updating the first and second tasks and allocations of warehousing resources among the first and second subsets of the automated guided vehicles, other equipment, and workers for performing the first and second tasks, wherein the iterative feedback loop comprises:

receiving, by the warehouse coordination system and from one or more data collection devices in the warehouse, the real-time warehouse data that indicates progress of the first and second tasks being performed over the shift for the first warehouse process and for the second warehouse process by the first and second subsets of the automated guided vehicles and by other equipment and workers in the warehouse according to the respective process plans, the first and second tasks including (i) unloading containers of goods from inbound vehicles, (ii) moving the containers throughout the warehouse, (iii) placing the containers in storage racks in the warehouse, (iv) retrieving the containers from the storage racks, and (v) loading the containers on outbound vehicles, wherein the real-time warehouse data specifies current locations of the containers of goods in the warehouse, current locations of the automated guided vehicles and the other equipment and workers in the warehouse, and the tasks being performed by the automated guided vehicles and the other equipment and workers for handling the containers of goods;

generating, using the real-time warehouse data and by accessing the cached first warehouse performance plan from the enhanced warehouse database, (i) first graphical user interface elements representing (a) a first predicted progress indictor that represents a projected progress of performing the first tasks at a current time during the shift and (b) a first actual progress indicator that represents actual performance of the first tasks at the current time during the shift, and (ii) first user input elements through which user input is received directing modifications in performance of a remaining portion of the first tasks and allocation of the resources to the first subset of the automated guided vehicles, other equipment, and workers for performing the remaining portion of the first tasks;

providing, to the first computing device, the first graphical user interface elements and the first user input elements, wherein the providing causes the first graphical user interface elements and the first user input elements to be displayed on the first computing device;

receiving, from the first computing device, first user input provided through the first user input elements, wherein the first user input direct modification of at least a portion of the first tasks and the allocation of the resources to the first subset of the automated guided vehicles, other equipment, and workers for performing the remaining portion of the first tasks;

updating, in the cache of the enhanced warehouse database, the first warehouse process plan based on the first user input;

providing, by the warehouse coordination system and for use in performing the remaining portion of the first tasks by the first subset of the automated guided vehicles, other equipment, and workers in the warehouse over the shift, the updated first warehouse process plan, wherein providing the updated first warehouse process plan causes the remaining first tasks to be performed by an updated first team within the warehouse comprising the updated first subset of the automated guided vehicles, other equipment, and workers;

generating, using the real-time warehouse data and by accessing the updated first warehouse performance plan and the cached second warehouse performance plan from the enhanced warehouse database, (i) second graphical user interface elements representing (a) a second predicted progress indictor that represents a projected progress of performing the second tasks at a current time during the shift and (b) a second actual progress indicator that represents actual performance of the second tasks at the current time during the shift, and (ii) second user input elements through which user input is received directing modifications in performance of a remaining portion of the second tasks and allocation of the resources to the second subset of the automated guided vehicles, other equipment, and workers for performing the remaining portion of the second tasks, wherein options presented in the second user input elements are informed based, at least in part, on the updates to the first warehouse process plan;

providing, to the second computing device, the second graphical user interface elements and the second user input elements, wherein the providing causes the second graphical user interface elements and the second user input elements to be displayed on the second computing device;

receiving, from the second computing device, second user input provided through the second user input elements, wherein the second user input direct modification of at least a portion of the second tasks and the allocation of the resources to the second subset of the automated guided vehicles, other equipment, and workers for performing the remaining portion of the second tasks;

updating, in the cache of the enhanced warehouse database, the second warehouse process plan based on the second user input; and providing, by the warehouse coordination system and for use in performing the remaining portion of the second tasks by the second subset of the automated guided vehicles, other equipment, and workers in the warehouse over the shift, the updated second warehouse process plan, wherein providing the updated second warehouse process plan causes the remaining second tasks to be performed by an updated second team within the warehouse comprising the updated second subset of the automated guided vehicles, other equipment, and workers.

2. The computer-implemented system of claim 1, wherein the warehouse data that represents the current state of the warehouse includes data that indicates locations and contents of containers of goods in the warehouse.

3. The computer-implemented system of claim 1, wherein the performance data includes data that indicates productivity rates of the workers as defined by a number of tasks previously performed by the workers over a defined time range.

4. The computer-implemented system of claim 1, wherein the real-time warehouse data includes one or more identifiers for a task that has been performed, and a timestamp that indicates a time at which the task has been performed.

5. The computer-implemented system of claim 1, wherein generating enhanced warehouse data includes generating configuration data that indicates how the warehouse is operationally and physically configured.

6. The computer-implemented system of claim 1, wherein performing the simulation of the tasks to be performed over the shift for the respective first and second warehouse processes includes applying productivity rates of the workers to be applied to the tasks to predict how many of the tasks are expected to be accomplished during the shift.

7. The computer-implemented system of claim 1, wherein performing the simulation of the tasks to be performed over the shift for the second warehouse process includes modeling the tasks to be performed according to an assigned sequence of tasks over time, using a collection of state variables that represent workers and containers of goods in the warehouse.

8. The computer-implemented system of claim 1, wherein the first performance monitoring interface and the second performance monitoring interface each include respective graphical indications of the real-time warehouse data over time relative to the respective first and second warehouse process plans over time.

* * * * *